(12) United States Patent
Baker, Jr. et al.

(10) Patent No.: US 6,828,618 B2
(45) Date of Patent: Dec. 7, 2004

(54) SPLIT-GATE THIN-FILM STORAGE NVM CELL

(75) Inventors: Frank K. Baker, Jr., Austin, TX (US); Alexander Hoefler, Austin, TX (US); Erwin J. Prinz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/283,748

(22) Filed: Oct. 30, 2002

(65) Prior Publication Data

US 2004/0084710 A1 May 6, 2004

(51) Int. Cl.$^7$ ................................................ H01L 29/76
(52) U.S. Cl. .................... 257/311; 257/314; 257/315; 257/316
(58) Field of Search .......................... 257/311, 314–317

(56) References Cited

U.S. PATENT DOCUMENTS

| | | | |
|---|---|---|---|
| 5,494,838 A | 2/1996 | Chang et al. | |
| 5,691,937 A | 11/1997 | Ohta | |
| 5,768,192 A | 6/1998 | Eitan | |
| 5,796,139 A | 8/1998 | Fukase | |
| 5,824,584 A | 10/1998 | Chen et al. | |
| 5,969,383 A | 10/1999 | Chang et al. | |
| 6,187,636 B1 | 2/2001 | Jeong | |
| 6,229,176 B1 | 5/2001 | Hsieh et al. | |
| 6,259,133 B1 | 7/2001 | Gardner et al. | |
| 6,335,554 B1 | 1/2002 | Yoshikawa | |
| 6,399,441 B1 | 6/2002 | Ogura et al. | |
| 6,423,632 B1 | 7/2002 | Samavedam et al. | |
| 6,429,073 B1 | 8/2002 | Furuhata et al. | |
| 6,570,213 B1 * | 5/2003 | Wu | 257/315 |

OTHER PUBLICATIONS

Chang, Kuo–Tung et al., "A New SONOS Memory Using Source–Side Injection for Programming," *IEEE Electron Device Letters*, Jul., 1998, pp. 253–255, vol. 19, No. 7.

* cited by examiner

Primary Examiner—Long Pham
Assistant Examiner—Nathan W. Ha
(74) Attorney, Agent, or Firm—Kim-Marie Vo; Patricia S. Goddard (57) ABSTRACT

A semiconductor nonvolatile memory cell (30) comprising a split-gate FET device having a charge-storage transistor (38) in series with a select transistor (39). A multilayered charge-storage gate dielectric (35) extends over at least a portion of the source (32) and a first portion (341) of the channel of the FET. A select gate dielectric (36), contiguous to the charge-storage gate dielectric, extends over at least a portion of the drain (33) and a second portion (342) of the channel. A monolithic gate conductor (37) overlies both the charge-storage gate dielectric and the select gate dielectric. In an embodiment, the charge-storage gate dielectric is an ONO stack that incorporates a thin-film nitride charge-storage layer (352). The select transistor operates to inhibit over-erasure of the NVM cell. The thin-film nitride charge-storage layer extends laterally over a substantial portion of the channel so as to enhance data retention by the cell.

22 Claims, 7 Drawing Sheets

SPLIT-GATE THIN-FILM STORAGE NVM CELL

BACKGROUND OF THE INVENTION

1. Field of the Invention

The subject invention relates generally to the design and fabrication of semiconductor devices and, more particularly, to the design and fabrication of a semiconductor nonvolatile memory (NVM) cell, wherein the NVM cell incorporates a thin film of charge-storage material for the retention of data.

2. Related Art

Semiconductor NVMs, and particularly electrically erasable, programmable read-only memories (EEPROMs), exhibit widespread applicability in a range of electronic equipments from computers, to telecommunications hardware, to consumer appliances. In general, EEPROMs serve a niche in the NVM space as a mechanism for storing firmware and data that must be refreshed periodically in situ. The EEPROM's precursor, the EPROM, can be erased only through UV irradiation and therefore requires removal from its target system prior to erasure. The flash EEPROM may be regarded as a specifically configured EEPROM that may be erased only on a global or sector-by-sector basis. The typical flash EEPROM may be divided into sectors of 64K (65, 536). The sacrifice in flash EEPROM erase selectivity is exchanged for a simplified memory cell design, which, in the limit, may require only a single MOS transistor.

As is well known to those skilled in the art, NVM cells are typically constructed by forming a field effect transistor (FET) in a body of semiconductor material, usually silicon. The FET can be made to store electrical charge (holes or electrons) in either a separate gate electrode, referred to as a floating gate, or in a dielectric layer underneath a control gate electrode. Data is stored in an NVM cell by modulating the threshold voltage, $V_T$, of the FET through the injection of charge carriers from the channel of the FET. For example, with respect to an N-channel, enhancement-mode FET, an accumulation of electrons in the floating gate, or in a dielectric layer above the FET channel region, causes the FET to exhibit a relatively high $V_T$. When the FET control gate is biased to the voltage required to read stored data, i.e., to a "Read" voltage, the FET will fail to conduct current because its then-existing threshold voltage is greater than the voltage applied to the gate. The nonconductive state of the FET may, by convention, be defined and detected as a logic level ZERO. Conversely, a reduction in the concentration of electrons in the floating gate, or in the dielectric layer, will cause the FET threshold voltage to diminish, and, in some designs, become negative with respect to ground. In this case, applying the Read voltage to the FET control gate will cause the FET to conduct current from drain to source. In some designs, the FET $V_T$ may be made negative so that an applied Read voltage of 0V will nonetheless be sufficient to cause current conduction by the FET. Current conduction by the FET may be defined and detected as a logic level ONE.

The EEPROM is encountered in numerous configurations. In general, those configurations may be classified according to (i) the nature (i.e., thickness and composition) of the layer used to store charge for $V_T$ modulation and (ii) the number of operative gate electrodes available to control the operation of the NVM cell. In particular, a floating-gate NVM cell is characterized by a stacked gate construction in which a floating gate, typically formed from polysilicon, is separated from the substrate by a first (lower) oxide layer and is separated from a polysilicon control gate by a second (upper) oxide layer. No direct electrical connection is made to the floating gate (hence, "floating"). A split-gate NVM cell typically exhibits two distinguishable channel regions, respectively controllable by the floating gate and the control gate, which are only partially overlapping. A discussion, not purported to be exhaustive, of known NVM configurations follows.

Figure 1:
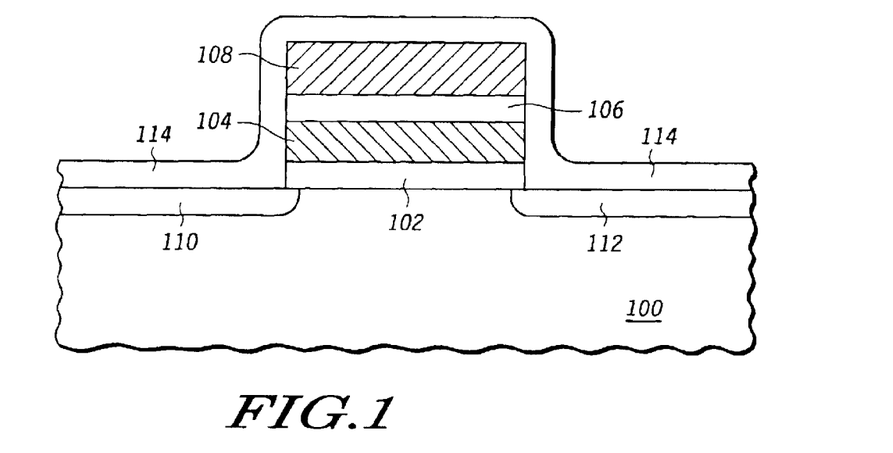
FIG. 1 is a cross-sectional view of a Floating-Gate NVM cell, in which there may be seen a floating gate (104) that is separated from a substrate by a first oxide layer (102) and is separated from a control gate (108) by a second oxide layer (106).

FIG. 1 depicts the more or less canonical configuration corresponding to a floating-gate tunnel oxide (Floating-Gate) NVM cell. The Floating-Gate cell includes a relatively thin tunneling oxide 102 interposed between a doped polysilicon floating gate 104 and a silicon substrate 100. Tunneling oxide 102 is typically thermally grown on substrate 100 to a thickness of approximately, for example, 100 angstroms. The Floating-Gate cell further includes an oxide layer 106 overlying floating gate 104 and underlying a doped polysilicon control gate 108. Fabrication of the Floating-Gate cell may involve successively forming layers 102, 104, 106, and 108 above silicon substrate 100. Portions of the layers not masked by a patterned photoresist layer are etched away to form the stacked structure shown in FIG. 1. A heavily concentrated dopant distribution that is self-aligned to the opposed sidewalls of the stacked structure may then be forwarded into substrate 100 to form source 110 and drain 112. An oxide layer 114 may be thermally grown upon the perimeter of the stacked structure and upon exposed regions of substrate 100 that overlie source 110 and drain 112. Due to exposure to thermal energy during this process, impurities implanted in source and drain regions 110 and 112 undergo lateral migration toward the channel region underneath tunneling oxide 102, resulting in the configuration depicted in FIG. 1.

In subsequent processing, control gate 108 will be coupled to a word line conductor. Bit line conductors can be formed within contact windows of oxide layer 114 for electrical connection to drain region 112. In one approach, floating gate 104 can be programmed by grounding source 110 and drain 112 and applying a relatively high voltage to control gate 108. During programming, electrons from the device substrate pass through tunneling oxide 102 into floating gate 104 by a tunneling mechanism known as Fowler-Nordheim tunneling. Those acquainted with semiconductor device physics understand Fowler-Nordheim tunneling as an instantiation of the quantum mechanical prediction that an electron will pass from the conduction band of one silicon region to that of another silicon region through an intervening silicon dioxide barrier, notwithstanding that such a travel is forbidden by notions of classical physics. See R. H. Fowler and L. Nordheim, "Electron Emission in Intense Electric Fields," *Proc. Roy.Soc. London*, A119, 173 (1928).

As electrons accumulate in floating gate 104, the accelerating electric field diminishes and the flow of electrons to floating gate 104 decreases. Programming of the memory cell is performed for a time that is sufficient to store a desired level of charge in the floating gate. Discharge of floating gate 104 to erase the cell can be achieved by grounding control gate 108, substrate 100, and source region 110 and applying a relatively high voltage to drain region 112.

Specifically, in order to program (write date to) the exemplary Floating-Gate cell depicted in FIG. 1, a voltage equal to approximately 20 volts (V) is applied to the control gate of the FET, while the drain is grounded. Current flows from the drain and through the channel so that electrons are injected through the oxide layer into the floating gate. As indicated above, electron injection occurs in this manner in accordance with Fowler-Nordheim tunneling effect. Injected electrons accumulate in the floating gate, causing the $V_T$ of the FET to increase and the intensity of the electric field between the gate and drain of the FET to increase.

In order to erase data previously written to the Floating-Gate EEPROM, the FET source, drain and substrate are grounded. A reverse bias of 20V is supplied to the control gate. Electrons that had accumulated in the floating gate during the immediately preceding programming operation flow to the substrate through the tunnel oxide layer 102, again in accordance with Fowler-Nordheim effects. As electrons vacate the floating gate, the FET $V_T$ decreases, as does the intensity of the electric field between the drain and the control gate.

The Floating-Gate cell structure, as described above, is seen to require the application of relatively high voltages (e.g., 20V) during both programming and erase operations. As a sequela to the requirement for high voltages and high currents, Floating-Gate cell characteristics, in general, and the integrity of the tunnel oxide, in particular, tend to rapidly suffer degradation. Furthermore, largely due to the necessity to generate substantial substrate current, erasure of data from a Floating-Gate cell is not directly available using a 5V supply.

Figure 2:
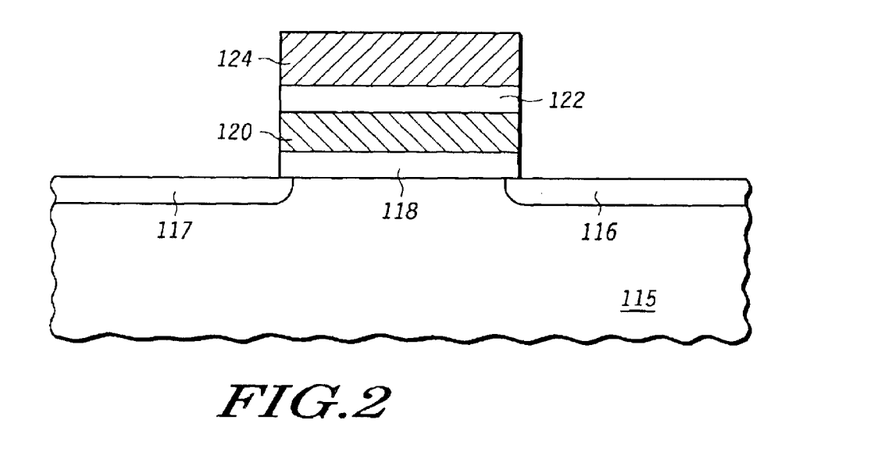
FIG. 2 is a cross-sectional view of SONOS NVM cell, in which there may be seen an uppermost polysilicon layer (124) separated from a nitride layer (120) by an oxide layer (122). Nitride layer (120) is separated from substrate (115) by oxide layer (118).

Proceeding now to FIG. 2, depicted there is an NVM cell similarly predicated on a floating-gate construction. However, in contradistinction to the Floating-Gate device of FIG. 1, the NVM cell depicted in FIG. 2 relies on a thin film of, for example, silicon nitride for charge storage and data retention. The nitride film is sandwiched between two oxide layers and the resultant multilayered structure is disposed on a semiconductor substrate. The oxide-nitride-oxide (ONO) stack is then clad with an uppermost layer of polysilicon. Hence, the acronym applied to this form of thin-film, floating-gate NVM construction is SONOS.

As seen in FIG. 2, in a typical embodiment, the SONOS NVM cell comprises a P-type substrate 115 in which there are formed an N$^+$ drain 116 and an N$^+$ source 117. Above the channel region between drain 116 and source 117, there is deposited a layer 118 of silicon dioxide, preferably between 20 and 100 angstroms in thickness, forming an electrical isolation over the device channel. On top of silicon dioxide layer 118 is a silicon nitride layer 120, preferably approximately 100 angstroms thick. The silicon nitride layer represents the memory retention layer of the SONOS cell, serving to trap hot electrons that are injected into the nitride layer. Another layer of silicon dioxide 122 is formed over the silicon nitride layer, preferably to a thickness of approximately 50–100 angstroms. Silicon dioxide layer 122 functions to electrically isolate a conductive gate 124 formed over the silicon dioxide layer 122. The layer forming the gate 124 typically is constructed from polysilicon. The SONOS cell is programmed and erased in a manner similar to the programming and erasing of the memory cell of FIG. 1.

Figure 3:
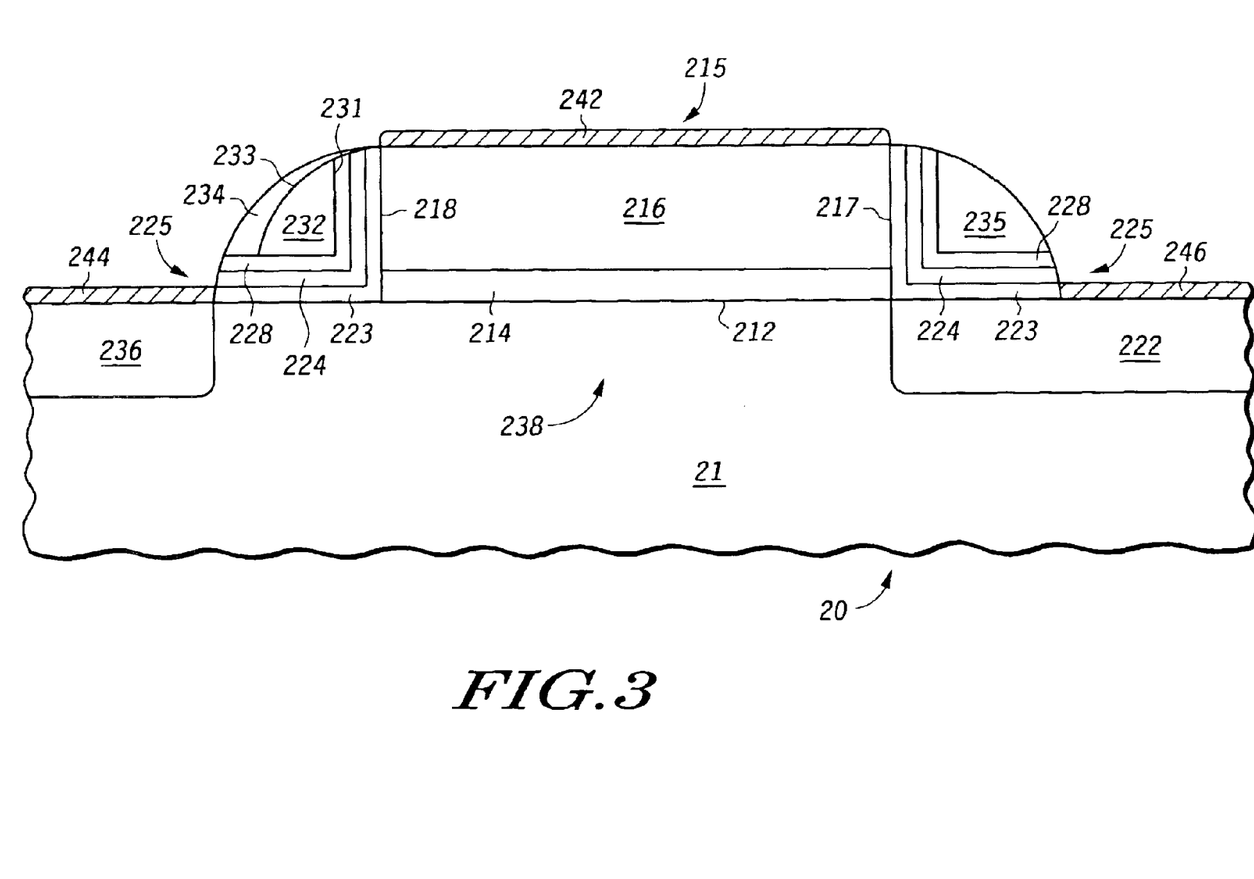
FIG. 3 is a cross-sectional view of split-gate, thin-film NVM cell, in which there may be seen a cell architecture that includes a select gate (216) and a sidewall control gate (232). The control gate is separated from a substrate (21) by an ONO stack (225).

FIG. 3 depicts, in detailed form, an example of an NVM cell that adopts a thin-film split-gate construction to effect source-side hot-carrier programming. A thorough description of the NVM device, including the design, fabrication, and operation thereof, may be had from U.S. Pat. No. 5,8247,584, Method of Making and Accessing Split Gate Memory Device, and U.S. Pat. No. 5,696,383, Split-Gate Memory Device and Method for Accessing the Same, each assigned to the assignee of this patent application and hereby incorporated by reference in its respective entirety.

As may be seen in FIG. 3, the split-gate, thin-film NVM cell 20 is formed on a body of semiconductor material, such as substrate 21, having a top or major surface 212. A select gate structure 215 includes a dielectric layer 214 overlying substrate 21 and a select gate 216 over the dielectric layer. Select gate 216 has sidewalls 217 and 218 opposite each other. By way of example, dielectric layer 214 may be a thermally grown silicon dioxide layer having a thickness between approximately 3 nanometers (nm) and 20 nm. Select gate 216 may be formed by depositing and patterning a conductive layer over a dielectric layer 214. Preferably, the conductive layer consists essentially of a polysilicon layer having a thickness between, for example, approximately 150 nm and 300 nm and is deposited over dielectric layer 214 using a chemical vapor deposition (CVD) process. Further, select gate 216 is preferably doped with ions of an N conductivity type, e.g., phosphorus or arsenic ions, either during a CVD process or during a subsequent doping step.

A drain region 222 is aligned with sidewall 217 of the select gate. By way of example, a self-aligned ion implantation process, which implants ions of N conductivity type, such as, for example, phosphorous or arsenic ions, into substrate 21 is used to form the drain region. Preferably, the ion implantation process is performed through a pad dielectric layer overlying major surface 212 of the substrate. The pad dielectric layer can be dielectric layer 214, a sacrificial oxide layer (not shown), or the like.

A dielectric layer such as, for example, a silicon dioxide layer 223 overlies portions of major surface 212 adjacent sidewalls 217 and 218 of select gate 216. Preferably, silicon dioxide layer 223 has a thickness between, for example, approximately 5 nm and 15 nm and may be formed using a thermal oxidation process or a deposition process. The thermal oxidation process also oxidizes select gate 216 along sidewalls 217 and 218. Therefore, silicon dioxide layer 223 is also formed along sidewalls. In one embodiment, portions of dielectric layer 214 that are left unprotected by select gate 216 are etched away before forming silicon dioxide layer 223 on a major surface 212. In another embodiment, silicon dioxide layer 223 is formed on the portions of dielectric layer 214 that are unprotected by select gate 216. A silicon nitride layer 224 having a thickness between, for example, approximately 5 nm and 15 nm overlies silicon dioxide layer 223. Silicon nitride layer 224 is preferably formed with a CVD process. Another dielectric layer, such as, for example, a silicon dioxide layer 228 having a thickness between approximately 5 nm and 15 nm overlies silicon nitride layer 224. Silicon dioxide layer 228 can be formed using a chemical vapor deposition process.

Silicon dioxide layer 223, silicon nitride layer 224, and silicon dioxide layer 228 form an oxide-nitride-oxide (ONO) stack, which is also referred to as a dielectric stack. In ONO stack 225, silicon dioxide layer 223 is referred to as a bottom dielectric layer, and silicon dioxide layer 228 is referred to as a top dielectric layer. When programming NVM cell 20, charge carriers, e.g., electrons, are injected into ONO stack 225 and are trapped in charge-trapping sites formed in silicon nitride layer 224. In order for NVM cell 20 to manifest an acceptable data retention rate, bottom dielectric layer 223 and top dielectric layer 228 are preferably optimized.

A control gate 232 overlies ONO stack 225. Control gate 232 has a sidewall 231 adjacent select gate 216 and has a sidewall 233 opposite to sidewall 231. By way of example, control gate 232 is formed by depositing and patterning a conductive layer over ONO stack 225. Preferably, the conductive layer is a polysilicon layer having a thickness between, for example, approximately 200 nm and 300 nm. The conductive layer is deposited over ONO stack 225 using a CVD process. In other words, control gate 232 is preferably formed as a polysilicon silicon sidewall spacer adjacent select gate 216. Further, control gate 232 is preferably doped with ions of N conductivity type, e.g., phosphorus or arsenic ions, either during the CVD process or during a subsequent doping step. It should be noted that the process of forming control gate 232 also forms a polysilicon sidewall spacer (not shown) along sidewall 217 of select gate 216. However, the polysilicon silicon sidewall spacer along sidewall 217 of select gate 216 does not participate in the operation of the NVM cell. In one embodiment, the vestigial sidewall spacer is removed in subsequent etching step, resulting in an NVM cell as shown in FIG. 3. In another embodiment (not shown), the polysilicon sidewall spacer is coupled to a reference voltage level, e.g., a ground voltage level, during the operation of accessing the NVM cell.

Dielectric spacers, such as, for example, nitride spacers 234 and 235, are formed along sidewall 233 of control gate 232 and along sidewall 217 of select gate 216, respectively. Preferably, a nitride spacer 234 covers control gate 232. Source region 236 is aligned with nitride spacer 234. By way of example, a self-aligned ion implantation process, which implants ions of N conductivity type, such as, for example, phosphorus or arsenic ions, into a substrate 21 is used to form source region 236. Source region 236 and drain region 222 define a channel region 238 therebetween. That is to say, a channel region 238 separates source region 236 from drain region 222 by a predetermined distance. A first portion of channel region 238 is positioned under ONO stack 225 and control gate 232; and a second portion of a channel region 238 is positioned under select gate structure 215. It should be understood that nitride spacers 234 and 235 are optional in the NVM cell. In an alternative embodiment, in which the NVM cell does not include nitride spacers 234 and 235, source region 236 is aligned with sidewall 233 of a control gate 232.

It should be noted that the processes of forming an ONO stack 225 over major surface 212 also forms an ONO stack on top of select gate 216 (not shown). The ONO stack on top of select gate 216 and portions of the ONO stack 225 (not shown) on major surface 212 that are unprotected by nitride spacers 234 and 235 are removed in an etching process.

A silicide structure 242 overlies select gate 216 and functions as the select gate electrode of the NVM cell. Likewise, a silicide structure 244 overlies source region 236 and functions as the source electrode of the NVM cell. In addition, a silicide structure 246 overlies a drain region 222 and functions as a drain electrode of the NVM cell. Silicide structures 242, 244, and 246 are aligned with nitride spacers 234 and 235. Thus, those structures are also referred to as self-aligned silicide (salicide) structures. Silicide structures reduce the parasitic resistance in the NVM cell and, therefore, improve the performance of the cell. However, it should be noted that silicide structures are optional features in the NVM cell.

Notwithstanding the advantages directly associated with the NVM gate structure depicted in FIG. 3 and described herein immediately above, it has been recognized that certain additional advantages may be realized through the implementation of an NVM gate structure that has not been heretofore disclosed or suggested. In a manner that will be made fully apparent below, the subject split-gate, thin-film storage NVM cell structure retains, or improves upon, device fabrication simplicity and economy. In addition, the salient features, advantages, and capabilities of the invention include improved uniformity among the NVM cells and mitigation of over-erase problems attendant some NVM cell configurations. Furthermore, the steps necessary to erase NVM cells are less stringent, and data retention by programmed NVM cells is improved. Also, the subject NVM cell is amenable to source-side hot-electron injection programming and source-side hot-hole injection erasure.

SUMMARY OF THE INVENTION

The above and other features, advantages and capabilities are realized in one aspect of the invention by a semiconductor device that comprises a semiconductor substrate that has a major, or uppermost, surface. A drain and a source are formed in the substrate of the semiconductor device, defining a channel therebetween. A charge-storage gate dielectric is disposed on the major surface over at least a portion of the source and at least a first portion of the channel. A select gate dielectric is disposed over at least a portion of the drain and a second portion of the channel region. A gate conductor is disposed over both the charge-storage gate dielectric and the select gate dielectric. In one embodiment, the gate conductor is monolithic in form.

A second aspect of the invention inheres in a semiconductor nonvolatile memory (NVM) cell. The NVM cell comprises a semiconductor body having a top surface; a drain formed in the semiconductor body; a source formed in the semiconductor body and spaced apart from the drain by a predetermined distance; a channel occupying at least a portion of the semiconductor body between the drain and the source; a first gate dielectric disposed on the top surface of the semiconductor device over at least a portion of the source; a second gate dielectric disposed on the top surface of the semiconductor device over at least a portion of the drain and juxtaposed to the first gate dielectric so that the first gate dielectric and the second gate dielectric together substantially cover an area of the channel at the top surface; and a gate conductor covering the first gate dielectric and the second gate dielectric.

A third aspect of the invention is apprehended in a gate structure for a nonvolatile memory (NVM) cell. The gate structure comprises a charge-storage gate dielectric, a select gate dielectric, and a monolithic gate conductor disposed over at least substantial portions of both the control gate dielectric and the select gate dielectric.

Another aspect of the invention is found in a semiconductor nonvolatile memory (NVM) dual cell that comprises a body consisting essentially of semiconductor material, the body having: a major surface; a first drain formed in the body of the semiconductor device; a second drain formed in the body of the semiconductor device; a common source formed in the body of the semiconductor device, the common source positioned laterally between the first drain and the second drain; a first channel in the body and defined by the first drain and the common source; a second channel in the semiconductor body and defined by the second drain and the common source; a first select gate dielectric disposed on the major surface over at least a portion of the first drain and at least a first portion of the first channel; a second select gate dielectric disposed over at least a portion of the second drain and a first portion of the second channel; a first charge-storage gate dielectric disposed over at least a portion of the common source, and a second portion of the first channel; and a second charge-storage gate dielectric disposed over at least a portion of the common source and a second portion of the second channel.

Accordingly, a corresponding aspect of the invention subsists in a method of operating a semiconductor nonvolatile memory (NVM) cell that is constructed to include (i) a drain and a source formed in a semiconductor substrate; (ii) a channel extending between the drain and the source and consisting essentially of a first channel portion proximal to the source and a second channel portion proximal to the drain; (iii) a charge-storage gate dielectric in the form of an ONO stack disposed over at least a portion of the source and the first channel portion and comprising a bottom insulating layer, an intermediate charge-storage layer, and a top insulating layer; (iv) a select gate dielectric consisting essentially of a single insulating layer; and (V) a gate conductor covering the control gate dielectric and the select gate dielectric. The cell is programmed by applying a programming row-select voltage to the gate conductor, applying programming a column-select voltage to the drain, and applying a programming bias voltage to the source so as to cause source-side hot-electron injection into the charge-storage layer of the ONO stack. The NVM cell is erased by applying an erase row-select voltage to the gate conductor, applying a first erase bias voltage to the substrate, and applying a second erase bias voltage to the source so as to cause source-side BTBT-induced hot-hole injection into the charge-storage layer of the ONO stack. The NVM cell is read by further applying a read row-select voltage to the gate conductor, applying a read column-select voltage to the drain, and applying a read bias voltage to the source so as to cause current to flow from the drain to the source of the NVM cell.

In a related aspect, the invention may be practiced as a fabrication process for a split-gate thin-film storage NVM cell. In accordance with the process, a semiconductor substrate of a predetermined first conductivity type is provided, on which substrate are successively formed a bottom insulating layer, an intermediate charge-storage layer, and a top insulating layer. A charge-storage gate dielectric stack is patterned from the above layers over a first portion of the semiconductor substrate. Then an impurity, of the same conductivity type as the substrate, is implanted into a second portion of the substrate. A select gate dielectric insulating layer is formed over the semiconductor substrate so that this insulating layer abuts, or is contiguous to, the charge storage-gate dielectric stack. A monolithic (polysilicon) gate conductor is deposited over the charge-storage gate dielectric stack and the select gate dielectric. An etching step is then applied to (i) a first portion of the gate conductor and a portion of the charge-storage dielectric stack (thereby forming a first sidewall) and (ii) a second portion of the gate conductor and a portion of the select gate dielectric (thereby forming a second sidewall). Exposed areas of the semiconductor substrate are implanted with an impurity of a conductivity type that is opposite to the conductivity type of the impurity earlier implanted. This implantation results in the formation of a source region that subtends at least a portion of the charge-storage gate dielectric stack and a drain region that subtends at least a portion of the select gate dielectric.

BRIEF DESCRIPTION OF THE DRAWINGS

The subject split-gate thin-film storage NVM cell may be better understood by, and its many features, advantages and capabilities made apparent to, those skilled in the art with reference to the Drawings that are briefly described immediately below and attached hereto, in the several Figures of which identical reference numerals (if any) refer to identical or similar elements and wherein.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF THE PREFERRED EMBODIMENTS(S)

For a thorough understanding of the subject, Split-Gate Thin-Film Storage NVM Cell, reference is made to the following Detailed Description, which includes the appended Claims, in connection with the above-described Drawings.

In a manner that will be made eminently clear below, the subject invention inheres, in one form, in an improved structure for a semiconductor nonvolatile memory (NVM) cell. The NVM cell structure exhibits a multilayered charge-storage gate dielectric, preferably, an ONO stack, and a substantially uniform select gate dielectric that consists of a single oxide layer. A monolithic polysilicon gate conductor extends across the tops of both the select gate dielectric and the charge-storage gate dielectric. The charge-storage gate is disposed to overlie the source region of the FET, and the select gate overlies the drain, resulting in an NVM cell that equivalently comprises a source-side, charge-storage region in series with a drain-side, enhancement-mode select MOSFET. The structure significantly mitigates, if not eliminates, the over-erasure problem to which many other NVM configurations are susceptible. In addition, data retention is improved by distributing stored electrons and/or holes in a region that is not constricted to a narrow area proximate to the source of the MOSFET. However, the charge-storage area is not required to extend across the entire channel region of the semiconductor device. In addition, the NVM cell so conceived enables numerous operational approaches as well. Both programming and erasure of the ONO stack may be achieved through a desired combination of Fowler-Nordheim tunneling and hot-electron or hot-hole injection.

Figure 4:
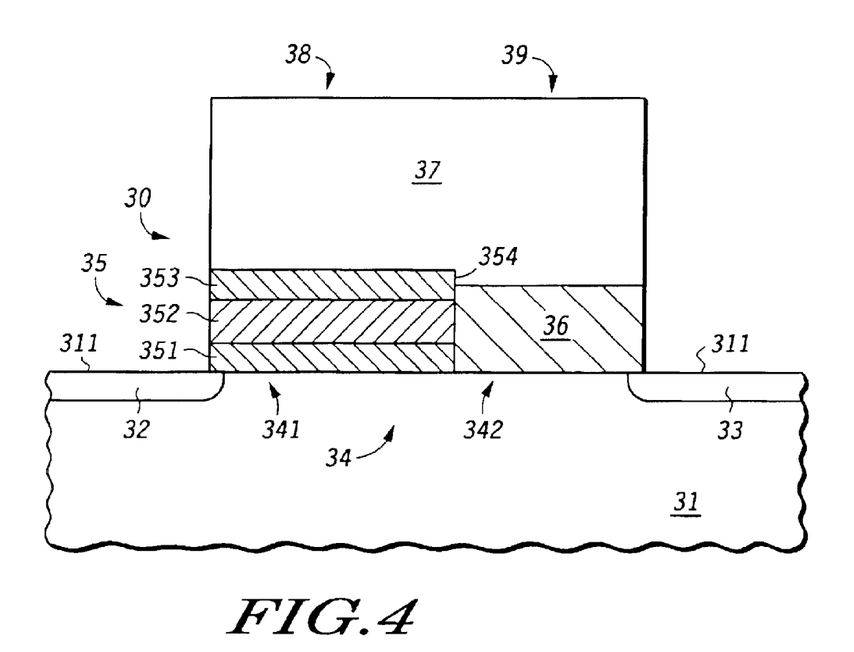
FIG. 4 is a cross-sectional view of an embodiment of the subject split-gate, thin-film storage NVM cell, depicting a first gate dielectric (35) comprising an ONO stack (351, 352, 353), a second gate dielectric (36), and a gate conductor (37).

Referring now to FIG. 4, there is depicted a cross-sectional view of a NVM cell 30 in accordance with an embodiment of the invention. As seen there, NVM cell 30 is constructed from a body of semiconductor material, or substrate 31, in which there are respectively formed a source 32 and a drain 33. (Those familiar with the art of semiconductor design and fabrication will likely understand that substrate 31 may be an epitaxial layer that is formed on an underlying layer of bulk silicon. Accordingly, source 32 and drain 33 are formed in the epitaxial layer grown on the underlying semiconductor substrate.) A channel region 34 extends between, and is defined by, source 32 and drain 33. Substrate 31 is delimited by a major, or uppermost, surface 311 at the uppermost area of source 32, drain 33 and channel 34. A charge-storage gate dielectric 35 is disposed on substrate surface 311 in a manner so that a substantial portion of source 32 and a substantial portion of channel 34 subtend charge-storage gate dielectric 35. Charge-storage gate dielectric 35 is multilayered, having as constituent layers a bottom layer 351, an intermediate layer 352, and an uppermost layer 353. Bottom layer 351 may be an insulating oxide; intermediate layer 352 may be a charge-storage nitride; and uppermost layer 353 may again be an insulating oxide. Accordingly, charge-storage gate dielectric 35 adopts the form of an ONO stack. A select gate dielectric 36 consists essentially of a single layer of insulating oxide. Charge-storage gate dielectric 35 and select gate dielectric 36 are disposed on surface 311 contiguous to, or in abutment with, each other. Gate dielectrics 35 and 36 are juxtaposed so that charge-storage gate dielectric 35 extends laterally from source 32 over a first portion 341 of channel 34, and select gate dielectric 36 extends laterally from drain 33 over a second portion 342 of channel 34. Together charge-storage gate dielectric 35 and select gate dielectric 36 substantially cover an upper area of channel 34 that extends to surface 311. A monolithic polysilicon gate conductor 37 overlies both charge-storage gate dielectric 35 and select gate dielectric 36.

In one embodiment, bottom layer 351 may be a layer of silicon dioxide having a thickness of 20 to 80 angstroms; intermediate layer 352 may be a layer of silicon nitride having a thickness of 50 to 150 angstroms; and top layer 353 may be a layer of silicon dioxide having a thickness of approximately 50 to 70 angstroms. Select gate dielectric 36 is a layer of silicon dioxide having a thickness of approximately 100 to 200 angstroms. Polysilicon gate conductor 37 has a thickness of approximately 1500 angstroms. With minimal circumspection it is apparent that NVM cell 30 is effectively equivalent to two MOSFET transistors, a charge-storage transistor 38, comprising gate conductor 37 and charge-storage gate dielectric 35, and a select transistor 39, comprising gate conductor 37 and select gate dielectric 36.

Figure 6:
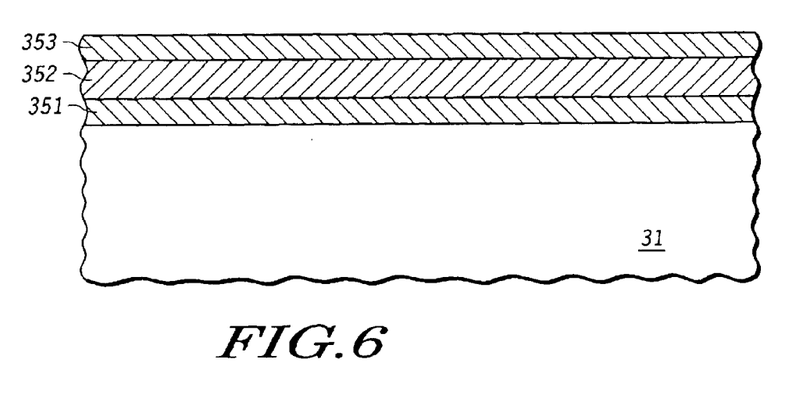
FIG. 6 through FIG. 10 constitute a process flow schematic that depicts steps encountered in the fabrication of the subject Split-Gate Thin-Film Storage NVM cell.
Figure 9:
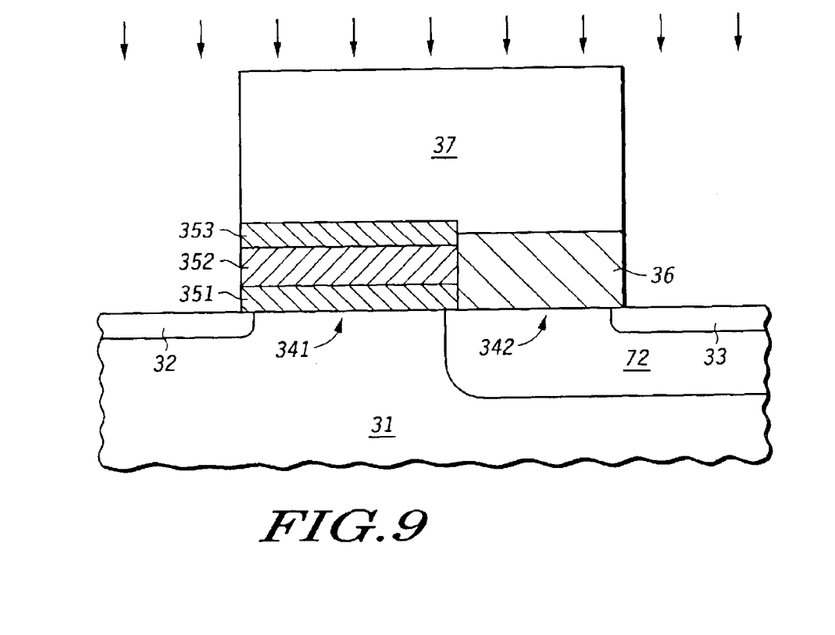
Figure 10:
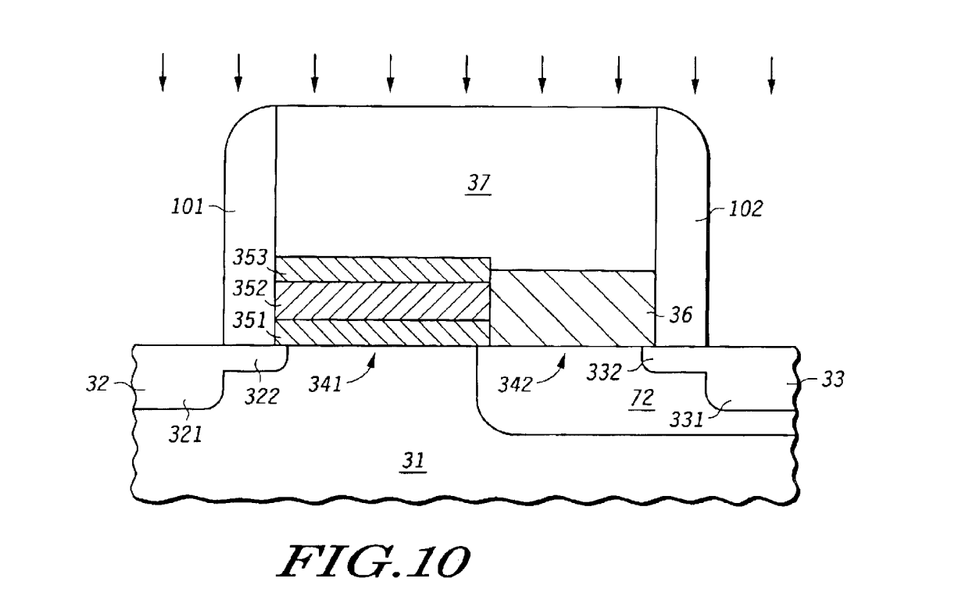

The relatively straightforward structure of NVM cell 30 suggests a concomitantly straightforward fabrication process that, in one embodiment, is illustrated in the process flow schematic that is set forth in FIG. 6 though FIG. 10. A first process module, depicted in FIG. 6, is directed to the formation of the ONO stack that constitutes charge-storage gate dielectric 35. Accordingly, a bottom insulating layer, in the form of oxide layer 351 is thermally grown on P-type substrate 31. Oxide layer 351 is grown to a thickness of 20 to 80 angstroms. In a preferred embodiment, oxide layer 351 may be grown nearer the thicker end of that range in order to afford improved data retention. Subsequently, an intermediate charge-storage layer, in the form of nitride layer 352, is deposited. Note that layer 352 need not necessarily consist of a nitride. Insulating materials that are capable of charge-storage are candidates for intermediate layer 352. Silicon oxynitride and silicon dioxide with charge-storage nanocrystals are among the viable alternatives. Deposition commonly is effected through low pressure chemical vapor deposition (LPCVD) techniques. The thin nitride film is deposited in a manner intended to optimize charge-storage density and/or trap energy. Charge-storage density is known to be dependent on the stoichiometry of the nitride film and may be controlled by varying the gas ratios, pressures and temperatures at which the LPCVD takes place. Typically silane will be mixed with other types of gases. As a next step, a top insulating layer, in the form of oxide layer 353, is formed, either by thermal growth or by a CVD technique, over intermediate charge-storage layer 352.

Here it is worth mentioning that, from one perspective, it is desirable that the ONO stack be as thin as possible so that charge carriers are able to move into and out of the nitride charge-storage layer to either the substrate or to the gate conductor with minimum voltage. However, as a countervailing consideration, both the bottom oxide 351 and the top oxide 353 need be sufficiently thick to provide the requisite level of data retention. Consequently, program/erase voltage is balanced against data retention. With respect to nitride thickness, a thinner layer allows a greater electric field to be generated with a given voltage. However, a thicker layer makes available a greater number of charge-storage sites. Optimization of these correlated considerations is achieved through software modeling, fine-tuned by empirical determinations.

Figure 7:
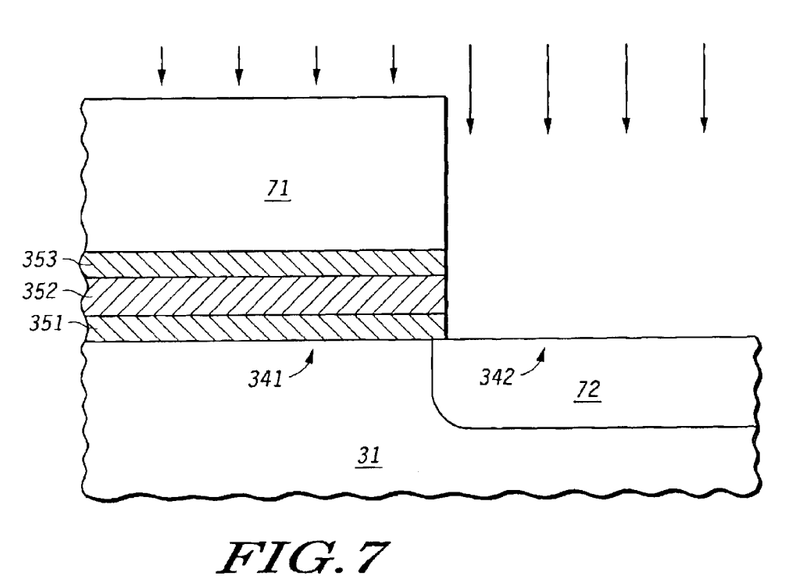

At this point, depicted in FIG. 7, a photoresist 71 is formed that effectively bisects the NVM cell by exposing areas of substrate 31 that will ultimately contain region 33 and by protecting subjacent areas of substrate 31 that will ultimately contain channel portion 341 and source region 32. (See, for example, FIG. 9) By a series of either wet or dry etches, top oxide 353 and nitride 352 are removed over drain region 33 and channel portion 342. Bottom oxide layer 351 may be optionally removed at this time or may be allowed to remain in place. Layer 351 is depicted as having been removed in FIG. 7. The effect of the immediately preceding steps is to pattern, in inchoate form, charge-storage gate dielectric 35 over channel portion 341. With the photoresist 71 remaining in place, an implant with a P-type impurity, e.g. boron, is performed in area 72 that increases the P-type doping in drain region 33 and in channel portion 342. The boron implant is performed to impart a differential between the $V_T$ of the charge-storage transistor and the $V_T$ of the select transistor so that the $V_T$ of the select transistor is greater than the $V_T$ of the charge-storage transistor.

In an embodiment, an objective of the fabrication process is to impart to the select device a natural $V_T$ approximately equal to 0.5 volts and to the charge-storage device a natural $V_T$ approximately equal to 0 volts. For purposes here, the "natural" $V_T$ (alternatively, the "charge-neutral" of $V_T$) of the charge-storage device is the value of $V_T$ that obtains when charge-storage sites are ubiquitously vacant. Because the select transistor is in series with the charge-storage transistor, the $V_T$ of the charge-storage transistor can never be less than the $V_T$ of the select transistor. That is, as long as the select transistor is nonconducting, the charge-storage transistor will likewise be nonconducting. By establishing the natural $V_T$ of the charge-storage transistor near 0 volts, the programmed $V_T$ and the erased $V_T$ can be arranged to be symmetrical about 0 volts. As will be explained in detail below, when the NVM cell is programmed to a logic zero, the charge-storage transistor exhibits a $V_T$ much greater than 0 volts and, therefore, does not conduct. When the NVM cell is erased to $V_T$ much less than 0 volts, it is comfortably conductive, provided that the select transistor is conductive. Conversely, with respect to unselected rows of memory array, the select device is non-conducting, thereby preventing column leakage, even when erased to $V_T$ much less than 0 volts.

Practitioners recognize that the above specification of the $V_T$ for each of the respective devices is, to a degree, a matter of choice to be exercised in the judicious discretion of the designer, based on numerous considerations and criteria. Accordingly, NVM cells having devices with dissimilar threshold voltages are nonetheless within the scope of the invention.

Figure 8:
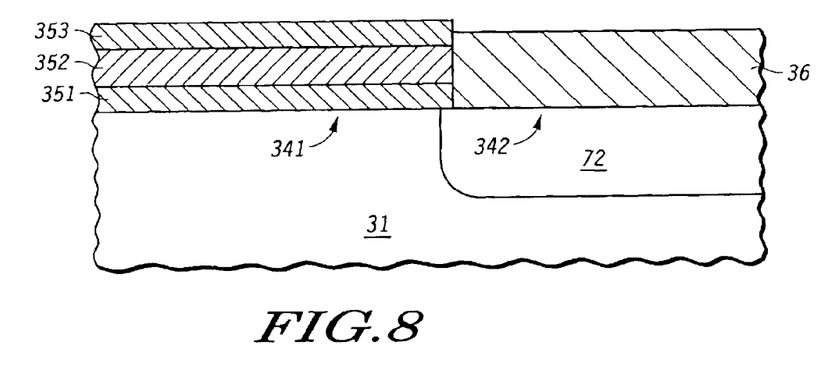

Referring now to FIG. 8, after the photoresist layer 71 is stripped, a fairly thick oxide layer 36 is grown over drain region 33. As is likely clear, oxide layer is here grown on an area of surface 311 that overlies what will subsequently become channel portion 342 and drain 33. Note that because intermediate nitride layer 352 serves as an oxidation barrier, this step adds only slightly to the thickness of top oxide layer 353. The relative thickness of oxide layer 36 to the thickness of the ONO stack is not deemed a critical aspect of the invention; however, the relationship depicted in FIG. 4, wherein oxide layer 36 terminates vertically at a point along the thickness of top oxide layer 353 of control gate dielectric 35, is considered favorable. As is readily apparent from FIG. 8, insulating layer 36, which ultimately will become the select gate dielectric, abuts ONO stack 35.

As shown in FIG. 9, a polysilicon layer is deposited and is subsequently lithographically etched to form gate conductor 37. This etching step also removes portions of ONO stack 35 and a portion of select gate dielectric 36 so as to result in a first sidewall 371 and a second sidewall 372. Sidewall 371 extends orthogonally from surface 311 at a point above channel portion 341; sidewall 372 extends orthogonally from surface 311 at a point above channel portion 342. In this manner self-alignment of the gate conductor 37 to ONO stack 35 and charge-storage gate dielectric 36 is achieved. With polysilicon gate conductor 37 in place, implantation with an N-type impurity is performed, resulting in the formation of lightly doped source region 322 and lightly doped drain region 332. A typical implant condition is 5E14/cm$^2$ arsenic at 10 keV.

Finally, as may be seen in FIG. 10, spacers 101 and 102 are formed on opposite sides of the gate structure. Spacer 101 is deposited on surface 311, over source 32 and alongside ONO stack 35 and gate conductor 37. Spacer 102 is deposited on surface 311, over a portion of drain 33 and alongside select gate dielectric 36 and gate conductor 37. The spacer material may be oxide, nitride or the like. With spacers 101 and 102 in place, another implantation is performed to impart a greater impurity concentration and depth to both source 32 and to drain 33, resulting in drain region 321 and source region 331. Typically, source and drain regions 321 and 331 will be an order of magnitude more heavily doped than, and have at least twice the depth of, lightly doped source and drain 322 and 332, respectively.

Figure 11:
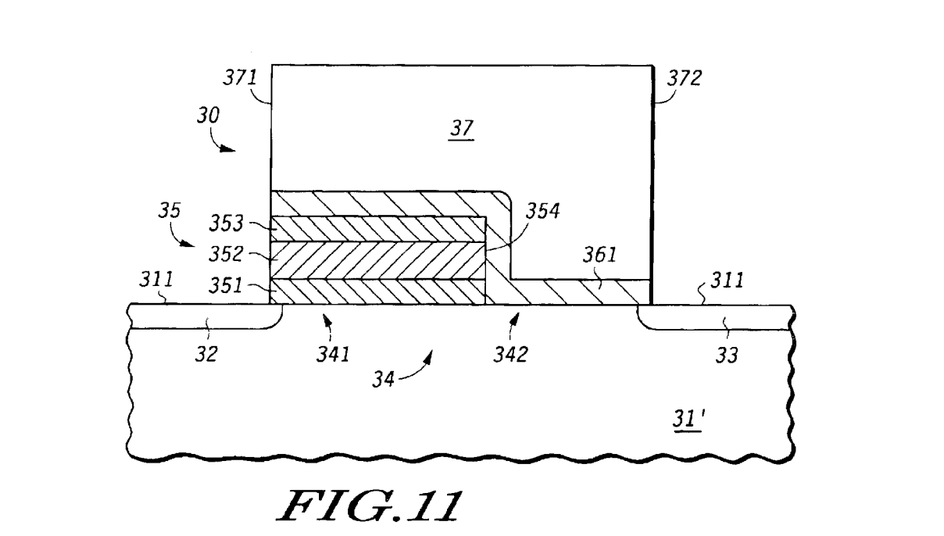
FIG. 11 is a cross-sectional view of an alternate embodiment of the subject split-gate, thin-film storage NVM cell, in which a continuous oxide layer (361) is formed over a top of the ONO stack, alongside a sidewall of the stack, and over a portion of channel (34) and drain (33).

An alternative to the process described above results in the NVM cell configuration depicted in FIG. 11. From FIG. 11 one may see that it is also possible, subsequent to the etching step that forms ONO stack 35 over channel portion 341, to form by LPCVD techniques an oxide layer 361 over the top of the ONO stack and down an interior sidewall 354 of the ONO stack. As seen in FIG. 11, interior sidewall 354 extends substantially orthogonally from surface 311 at a point between channel portions 341 and 342. Oxide layer 361 continues over the top of surface 311 over channel portion 342. This oxide layer may serve as the gate dielectric for the select transistor, or additional oxide may be thermally grown to supplement layer 36. Formation of oxide along sidewall 354 will prevent charge leakage from nitride 352 to polysilicon layer 37.

Figure 5:
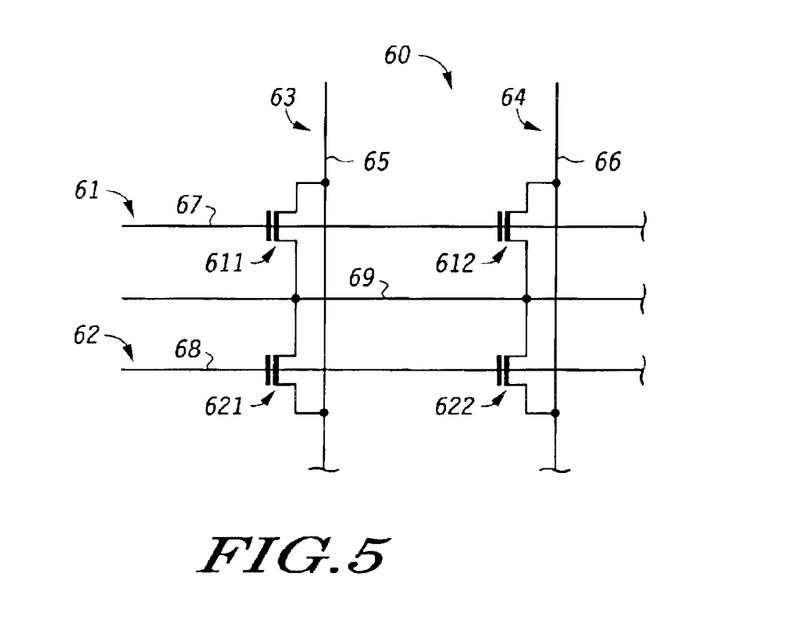
FIG. 5 is a circuit diagram of a small portion of an EEPROM array that incorporates the subject split-gate, thin-film storage NVM cell.

In practical application, the NVM cell described hereinabove and depicted in FIG. 4 will be replicated numerous times to form a memory array. A small portion of such a memory array configuration is illustrated in the circuit diagram, FIG. 5. The memory cell arrangement depicted there will be recognized as conforming to the familiar NOR architecture. Referring now to FIG. 5, those skilled in the art will recognize memory array 60 to include a plurality of rows 61, 62, . . . and a plurality of columns 63, 64 . . . For purposes of explication, the array may be arbitrarily assumed to be characterized by 8-bit words and to have a sector size of 64K (65,536) words. A memory array so dimensioned will therefore be populated by 512K NVM cells. The NVM cells will, to the extent permitted by operative device fabrication processes, be substantially identical in form and performance. For convenience, only the first two rows, 61 and 62, and the first two columns, 63 and 64, of memory array 60 are shown in FIG. 5. Similarly, only four NVM cells, 611, 612, 621, and 622, respectively, are shown.

With continued reference to FIG. 5, a first word line 67 is sequentially coupled to the gate conductors of cell 611 and cell 612, as well as to the gate conductors of the remaining cells (not shown) that constitute row 61. A second word line 68 is likewise sequentially coupled to the gate conductors of cell 621 and of cell 622, as well as to the gate conductors of the remaining cells (not shown) that constitute row 62. A first bit line 65 is sequentially coupled to the drain of cell 611 and to the drain of cell 621, as well as to the respective drains of the remaining cells (not shown) that constitute column 63. A second bit line 66 is likewise sequentially coupled to the drain of cell 612 and to the drain of cell 622, as well as to the drains of the remaining cells (not shown) that constitute column 64. The respective sources of each of cells 611,612, . . . , and 621, 622, . . . , that constitute rows 61 and 62 are commonly connected and are coupled to a source line 69. Those having routine familiarity with the design and operation of memory arrays understand that bit lines 65,66 . . . are coupled to a sense amplifier (not shown) that determines the logic state of appropriately addressed memory cells by virtue of the drain-to-source current that flows in those cells. Similarly, those having such familiarity understand that the arrangement of cells illustrated in FIG. 5 is simply extrapolated to form the remaining rows of memory array 60 and that a corresponding source line is provided for each of the remaining row pairs. Schemes for addressing the contents of memory array 60 are deemed collateral to the invention and are, accordingly, not treated here. However, methods of programming, erasing, and reading the contents of memory array 60 are deemed germane, and are discussed in detail immediately below.

Application of the NVM cell FIG. 4 in a memory array such as the NOR array of FIG. 5 necessarily involves the performance of three operations: programming the NVM cell, erasing the NVM cell, and reading data from the NVM cell. These functions are achieved through appropriately biasing the gate conductor, the source region, and the drain region of NVM cell to selected predetermined voltages.

Programming Operation. In the embodiment of FIGS. 4 and 5, the NVM cell is programmed by applying a programming row-select voltage of 5V to source 32 and to gate conductor of cells resident in a selected row. The voltage at the gate conductor of cells in an unselected row is approximately 0 volts. A programming column-select voltage of 0 volts is applied to the drains of cells in a selected column, and 5V is applied to the drains of cells in unselected columns.

Because in the course of programming an NVM cell, the source region is at a higher voltage level than the drain region, an N-channel split-gate FET operates in a reverse active mode. In other words, during a programming operation, the source region functions as a drain of the FET, and the drain region functions as a source of the FET. Further, the select gate conductor is at a voltage level higher than the voltage level of the drain region by at least a threshold voltage of a portion of channel region 342 under the select gate structure. Thus, the portion 342 of channel region under the select gate structure is switched on and is conductive. Negative charge carriers, e.g., electrons, originate from the source region and are accelerated through the portion of the channel region between select gate structure and the charge-storage gate. When the electrons reach the portion of channel region 341 adjacent to the source region, they are attracted by the high voltage at the gate conductor 37. In a hot-carrier injection process, the charge carriers (e.g., electrons) are injected across oxide layer 351 and are trapped in a portion of silicon nitride layer 352 above channel portion 341. As the negative charge carriers traverse channel region 34 into silicon nitride layer 352, the threshold voltage of the portion of channel region 341 increases. Thus, the current flowing through the channel region decreases, as does the rate of hot-carrier injection. After the programming voltages are removed from NVM cell, the injected carriers remain trapped in silicon nitride layer 352. A first logic value, e.g., a logic ZERO is stored in the NVM cell, i.e., the NVM cell is programmed.

Erase Operation. In order to erase NVM cell 30, an erase row-select voltage of −6V is applied to gate conductor 37 of cells in a selected row. An erase bias voltage of 5V is applied to the source of each cell. The drain of each cell is grounded or is allowed to float. 0V is applied to the gate conductor of cells in unselected rows.

Because, during an erase operation, the gate conductor is at a voltage that is negative with respect to the drain, channel portion 342 is assured to be nonconductive. In addition, because of the voltage difference between source 32, substrate 31 and gate conductor 37, a strong electric field is established in portion 341 of channel region. Through a band-to-band tunneling (BTBT) process (wherein the semiconductor electrons traverse the gap between the conduction band and the valence band), the strong electric field generates electron-hole pairs in source region 32 adjacent to channel portion 341. The holes, which are positive charge carriers, are attracted by the negative voltage at gate conductor 37. In a hot-carrier injection process, the holes are injected across oxide layer 351 into silicon nitride layer 352 of ONO stack 35, where they neutralize the electrons in silicon nitride layer 352. Preferably, the erasing process continues until silicon nitride layer 352 becomes substantially electrically neutral or positively charged. After the erasing voltages are removed from the NVM cell, silicon nitride layer 352 remains substantially neutral or positively charged. In either case, a second logic value, e.g., a logic ONE, is imparted to the NVM cell, i.e., NVM cell is erased.

During the erasing process, the charges stored in the charge-trapping sites in silicon nitride layer 352 are neutralized by charges of opposite polarity injected from channel region. When compared to a Fowler-Nordheim tunneling approach, the erasing process of the present invention allows a thicker top and bottom dielectric layers in ONO stack, thereby improving the data retention of NVM cell.

Read Operation. In the course of the read operation, a read row-select voltage of approximately 1.2V is applied to the gate conductor of each NVM cell in a selected row. Similarly a read column-select voltage of 0.5 to 1.2V is applied to the drain of each NVM cell resident in the selected column. The read bias voltage at the source region of each NVM cell is at 0V. Current will flow only if the ONO stack of the charge-storage transistor has been erased so that charge-storage sites of nitride layer 352 are neutral or are populated with holes. If the cell had previously been programmed (without an intervening erase), those sites will be populated with electrons, and no current will flow.

If the NVM cell has been programmed, the silicon nitride layer under the gate conductor will be negatively charged. Channel portion 341 has a threshold voltage that is higher than its natural (i.e., charge-neutral) threshold voltage, which occurs when the silicon nitride layer under the charge-storage gate is substantially neutral. If the NVM cell has been erased, the silicon nitride layer is substantially neutral or positively charged. In this case, channel portion 341 has a threshold voltage that is substantially equal to or lower than its intrinsic threshold voltage. The reading voltage is preferably lower than the threshold voltage of channel portion 341 if NVM cell has been programmed. In addition, the reading control gate voltage is preferably higher than the threshold voltage of channel portion 341 if NVM cell has been erased. Therefore, when reading data from a programmed NVM cell, the channel region is nonconductive, and the current level flowing through the channel is low, e.g., equal or less than approximately 2 microamperes ($\mu$A). A sense amplifier (not shown) coupled to drain region via a bit line (see FIG. 5) senses the low-level current and reads the first logic value, e.g., logic ZERO, from NVM cell. On the other hand, when reading data from an erased NVM cell, channel region 341 is conductive, and the current flowing therethrough is relatively large, e.g., equal to or greater than approximately 10 $\mu$A. The sense amplifier (not shown) coupled to the drain region senses the large current and reads the second logic value, logic ONE, from the NVM cell.

During the reading process, the source region is at a lower voltage level than the drain region. The voltage drop across the channel region is insubstantial. Thus, the probability that charge carriers will be inadvertently injected from channel region into silicon nitride layer is negligible. In other words, the disturbance to the data stored in NVM cell during the reading process is inconsequential. In accordance with the present invention, the sense amplifier (not shown) is coupled to drain region 33 via a bit line, and drain region 33 is separated from silicon nitride layer 352 by the select gate structure. Therefore, the parasitic bit line capacitance is substantially independent of the charge trapped in silicon nitride layer 352. In other words, the data dependence of the parasitic bit line capacitance is small in the subject NVM cell. An NVM cell, such as NVM cell 30, having a small data dependence of the bit line capacitance is suitable for high performance applications.

The subject invention, in an alternative embodiment, also enables a potentially more compact construction, wherein a portion of the device active area is shared between two adjacent cells. Specifically, a common source region is shared between two cells that are column-wise adjacent. Of course, a salient advantage of the suggested alternative structure is a direct enhancement in the cell density (number of memory cells resident on a specified area of the device). The alternative cell structure is depicted in FIG. 12.

Figure 12:
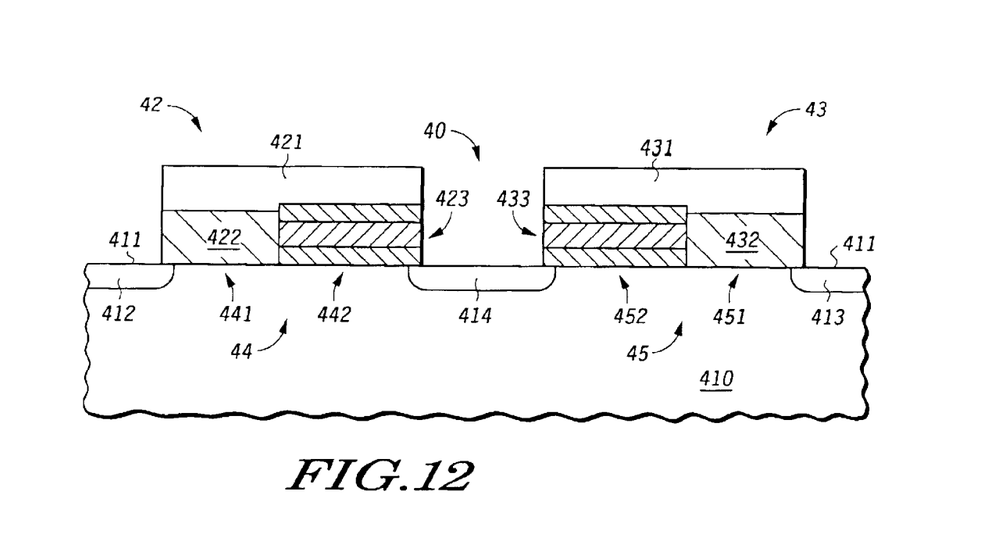
FIG. 12 is a cross-sectional view of a dual NVM cell, in which there is depicted an NVM cell architecture whereby a common source region (414) is shared between two column-adjacent NVM cells.

As may be seen in FIG. 12, NVM dual cell 40, comprising dual cells 42 and 43, is formed in a body of semiconductor material 410, which may be P-type silicon, having a major, uppermost surface 411. A first N-type drain 412 is formed in body 410, as is a second N-type drain 413. Drains 412 and 413 are spaced apart laterally in body 410 by a predetermined distance. A common source 414 is formed in body 410 and is positioned laterally between drain 412 and drain 413. Drain 412 and common source 414 define a first channel 44, and drain 413 and common source 414 define a second channel 45. A first select gate dielectric 422 is disposed on major surface 411 over at least a portion of drain 412 and a first portion 441 of first channel 44. Portion 441 may be seen in FIG. 12 to be the portion of channel 44 that is nearer to drain 412 than to common source 414. A first charge-storage gate dielectric 423 is disposed on major surface 411 over common source 414 and over second portion 442 of first channel 44. Again, first charge-storage gate dielectric 423 is a multilayered ONO stack that comprises a bottom oxide insulating layer, an intermediate nitride charge-storage layer, and a top oxide insulating layer. A monolithic polysilicon first gate conductor 421 is disposed over first charge-storage gate dielectric 423 and over first select gate dielectric 422. A second select gate dielectric 432 is disposed on major surface 411 over at least a portion of drain 413 and a first portion 451 of second channel 45. Portion 451 may be seen in FIG. 12 to be the portion of channel 45 that is nearer to drain 413 than to common source 414. A second charge-storage dielectric 433 is disposed on major surface 411 over common source 414 and over second portion 452 of second channel 45. As before, charge-storage gate dielectric 433 is a multilayered ONO stack that comprises a bottom oxide insulating layer, an intermediate nitride charge-storage layer and a top oxide insulating layer. A monolithic polysilicon second gate conductor 431 is disposed over second charge-storage gate dielectric 433 and second select gate dielectric 432. It may be readily appreciated that the constituent elements of NVM dual cell 40 include a first select transistor (drain 412, channel portion 441, gate dielectric 422 and gate conductor 421, a second select transistor (drain 413, channel portion 451, gate dielectric 432, and gate conductor 431, a first charge-storage transistor (common source 414; channel portion 442, dielectric ONO stack 423, and gate conductor 421; and a second charge-storage transistor (common source 414, channel portion 452, dielectric ONO stack 433, and gate conductor 431).

A memory array constituted from an arrangement of NVM cells, such as the NVM that have been described herein, has pervasive applicability. In particular, the subject NVM cell may, as indicated above, be used in the fabrication of EEPROMs. As is well known, many microprocessor-based systems are predicated on the functionality afforded by an associated EEPROM. For example, personal computers (PCs) of every variety, e.g., desktops, laptops, notebooks, etc., almost invariably include a microprocessor that relies on an EEPROM for at least some aspect of its operation. For example, in the context of PCs, a flash EEPROM may be used to store the PC's BIOS, thereby allowing the BIOS to be periodically updated, perhaps remotely, as required. An exemplary configuration of a microprocessor-based electronic system that incorporates an NVM array, (for example, an EEPROM) is depicted in FIG. 13.

Figure 13:
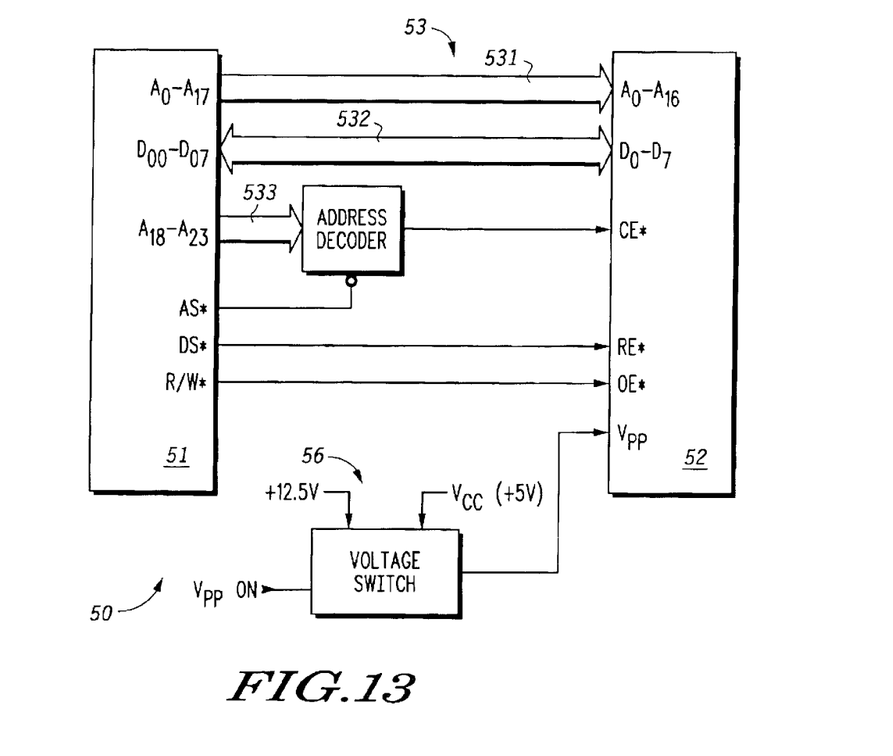
FIG. 13 is a system block diagram of processor-based equipment into which the subject split-gate, thin film storage NVM may be vertically integrated.

Referring now to FIG. 13, it may be seen that the processor-based system depicted there includes a microprocessor 51 coupled to an EEPROM 52. In practice EEPROM 52 will often be a flash EEPROM. Specifically, microprocessor 51 is coupled to EEPROM 52 by a bus system 53 that includes an address bus 531, a data bus 532, and a chip-select address bus 533. That is, address bus 531 couples the address (A01–A17) output of microprocessor 51 to the address input (A0–A16) of EEPROM 52. Data bus 532 couples the data port of microprocessor 51 to the data port of EEPROM 52, thereby effecting bi-directional transfer of data between the two devices. Chip-select bus 533 couples the address that corresponds to the EEPROM's allocated memory space through an address decoder 54 to the active-low chip-enable (CE*) input of EEPROM 52. The active-low data strobe (DS*) output and the read/(active-low) write (R/W*) output of microprocessor 51 are respectively applied to the active-low read-enable (RE*) and active-low output-enable (OE*) inputs of EEPROM 52. In some systems it is necessary, or at least desirable, to be able to switch the voltage supply input Vpp to EEPROM 52. To this end, system 50 includes supply switching circuitry 56. However, note that the subject invention requires a Vpp of, typically, only 5 to 6V.

A detailed explication of the idiosyncratic algorithms and protocols that govern the interaction of microprocessor 51 and EEPROM 52 is deemed not necessary to the promotion of a thorough understanding of the subject invention and, therefore, is not provided here. However, the interested reader is referred to Alan Clements, *Microprocessor Systems Design*: 6800 *Hardware, Software and Interfacing* (PWS Publishing Company, 1997). Furthermore, it goes without saying that the subject split-gate, thin-film storage NVM cell has wide-ranging utility in many forms of electronic equipment. Accordingly, the system depicted in FIG. 13 is properly to be regarded as but an example, albeit one often encountered, of the manner in which the subject invention substantially contributes to the value of systems in which it is exploited. Those acquainted with EEPROM capabilities are well aware that embedded flash EEPROMs are also extensively deployed in many system-on-a-chip designs.

From the above Description, it should be clear that that subject Split-Gate, Thin-Film Storage NVM Cell, in its numerous embodiments, is singular in the many features, advantages, and capabilities that it affords. To wit:

The subject NVM cell structure lends itself to relatively straightforward fabrication processes, roughly equivalent in simplicity to the fabrication processes pertinent to a SONOS device.

The NVM cell structure is compatible with a NOR memory cell architecture with a common source and common well. This feature is not trivial because of design constraints widely known to be associated with the NOR architecture. Specifically, in a NOR structure using conventional memory cells, it is not permitted that cells be erased with a $V_T$ less than 0 volts. Otherwise, even with nonselected gates biased to a 0V, the gate with $V_T$ less than 0 volts will conduct. Because the devices in a NOR array are effectively connected in parallel (with the sources of all the devices and the drains of all devices in a column connected in common as shown in FIG. 5), the conduction of any one device prevents others from being read. Therefore, even the low-$V_T$ state of such cells must be greater than 0 volts. This anomaly is circumvented in the subject NVM cell structure through the operation of the series-connected select transistor. That is, if the select transistor is non-conducting, then the paired charge-storage transistor cannot conduct, even with a negative $V_T$.

The subject NVM cell structure enables a row-level erase for small-sector EEPROM emulation. This capability results from the confinement of BTBT to only the row with selected gates.

The relatively thick (25–80 angstroms) bottom dielectric layer can be expected to enhance the characteristics of the NVM device with respect to both data retention and read disturb. As is known in the art, "read disturb" refers to a phenomenon in which the integrity of data stored in an NVM cell is compromised by the very attempt to access, or read, the data. Read disturb effects may be minimal for a single read event directed to a particular NVM cell. However, the aggregate effect of numerous read attempts may be to reverse the data stored in the cell. Physically this means that the number of carriers stored in the charge-storage layer is altered by a read attempt, so that an erased cell presents as having been programmed and a programmed cell presents as having been erased. Furthermore, the data retention and read disturb performance benefit from another NVM cell structural characteristic as it relates to the width of the nitride layer. That is, because the nitride layer extends approximately half the length of the channel, stored electrons and holes are not confined to a restricted region in proximity to the area where the greatest degree of dielectric damage occurs, in the vicinity of the source junction. Therefore, the tendency for stored carriers to vacate the nitride layer through a damaged area of the lower insulating layer is reduced.

The NVM cell operates with similar biasing voltages applied to the gate, source and drain during programming and erase operations. The magnitudes of these bias voltages can be maintained below the 5–6 volt range.

The cell structure can be deployed in a scheme based on Fowler-Nordheim tunneling for both programming and erase.

By providing an enhancement-mode select transistor in series with the charge-trapping transistor, problems related to over-erasure are obviated. Over-erase can occur when, in the process of erasing the contents of an NVM cell, and in an attempt to ensure thorough removal of carries (e.g., electrons) previously injected in a programming step, the erasure operation is sustained for a prolonged duration. As a result, an excessive amount of charge will be removed, so that a net positive charge exists in the charge-storage layer. The $V_T$ of the charge-storage transistor can then become negative, causing the charge-storage transistor to become, in effect, a depletion-mode device that conducts, even in the absence of the positive voltage at the gate conductor. Because the enhancement-mode select transistor has low leakage current when the voltage at the gate conductor is 0 volts, the NVM cell will not conduct current, even if the charge-storage device is erased to $V_T$ less than 0 volts. Accordingly, other NVM cells sharing the same bit line can be erased below 0 volts without contributing to column leakage current.

In the description above, the invention has been set forth in the context of specific numerous embodiments, in a manner that is intended to be illustrative and to convey a thorough comprehension of the invention. However, one of ordinary skill in the art pertaining to the design and fabrication of semiconductor nonvolatile memory devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and thicknesses identified herein. Similarly, those skilled in the art understand that conductivity types (P-type, N-type) may, in general, be reversed, provided that requisite consistency is preserved. Accordingly, the Description and the Figures are properly construed are illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

We claim:

1. A semiconductor device comprising:
   a semiconductor substrate having a major surface;
   a drain formed in the substrate;
   a source formed in the substrate, the drain and the source defining a channel therebetween;
   a charge-storage gate dielectric disposed on the major surface over at least a first portion of the channel;
   a select gate dielectric disposed on the major surface over at least a second portion of the channel so that the charge-storage gate dielectric and the select gate dielectric are contiguous; and
   a gate conductor disposed over both the select gate dielectric and the charge-storage gate dielectric.

2. A semiconductor device as defined in claim 1, wherein the charge-storage gate dielectric is multilayered.

3. A semiconductor device as defined in claim 2, wherein the charge-storage gate dielectric comprises:
   a bottom insulating layer;
   a top insulating layer; and
   an intermediate charge-storage layer.

4. A semiconductor device as defined in claim 3, wherein the bottom insulating layer is an oxide, the top insulating layer is an oxide, and the intermediate charge-storage layer is a charge-storage dielectric selected from the class comprising a nitride, silicon oxynitride, and silicon dioxide with charge-storage nanocrystals.

5. A semiconductor device as defined in claim 4, wherein the bottom insulating layer is approximately 20 to 80 angstroms in thickness and the intermediate layer is approximately 50 to 150 angstroms in thickness.

6. A semiconductor device as defined in claim 3, wherein the select gate dielectric consists essentially of a single insulating layer.

7. A semiconductor device as defined as claim 6, wherein the substrate comprises a first region subtending the charge-storage gate dielectric and a second region subtending the select gate dielectric and wherein the second substrate region is doped with a higher impurity concentration than is the first substrate region.

8. A semiconductor nonvolatile memory (NVM) cell comprising:

a semiconductor body having a top surface;

a drain formed in the semiconductor body;

a source formed in the semiconductor body and spaced apart from the drain by a predetermined distance;

a channel occupying at least a portion of the semiconductor body between the drain and the source;

a first gate dielectric disposed on the top surface of the semiconductor body, wherein the first gate dielectric comprises an ONO stack;

a second gate dielectric disposed on the top surface of the semiconductor body and juxtaposed to the first gate dielectric so that the first gate dielectric and the second gate dielectric together substantially cover an area of the channel at the top surface; and a monolithic gate conductor covering the first gate dielectric and the second gate dielectric.

9. A semiconductor NVM cell as defined in claim 8, wherein the first gate dielectric and the second gate dielectric are positioned in abutment.

10. A gate structure for a nonvolatile memory (NVM) cell, the gate structure disposed over a channel and over at least respective portions of a source and a drain of the cell and comprising:

a charge-storage gate dielectric a select gate dielectric; and a monolithic gate conductor disposed over at least substantial portions of both the charge-storage gate dielectric and the select gate dielectric.

11. A gate structure as defined in claim 10, wherein the charge-storage gate dielectric comprises a multilayered stack consisting essentially of a bottom insulating layer, a top insulating layer, and an intermediate charge-storage layer.

12. A gate structure as defined in claim 11, wherein the charge-storage gate dielectric comprises an ONO stack.

13. A gate structure as defined in claim 12, wherein the charge-storage gate dielectric is contiguous to the select gate dielectric.

14. A gate structure as defined in claim 11, wherein the intermediate charge-storage layer is a dielectric selected from the class comprising a nitride, silicon oxynitride, and silicon dioxide with charge-storage nanocrystals.

15. A gate structure as defined in claim 14, wherein the charge-storage gate dielectric comprises an ONO stack.

16. A gate structure as defined in claim 12, wherein the ONO stack has a sidewall positioned over the channel and the select gate dielectric comprises a continuous oxide layer subtending the gate conductor and extending over a top layer of the ONO stack, alongside the sidewall, and over a portion of the channel.

17. A semiconductor nonvolatile memory (NVM) dual cell comprising:

a body consisting essentially of semiconductor material, the body having a major surface;

a first drain formed in the body of the semiconductor device;

a second drain formed in the body of the semiconductor device;

a common source formed in the body of the semiconductor device, the common source positioned laterally between the first drain and the second drain;

a first channel in the semiconductor body and defined by the first drain and the common source;

a second channel in the semiconductor body and defined by the second drain and the common source;

a first select gate dielectric disposed on the major surface over at least a first portion of the first channel;

a second select gate dielectric disposed over a first portion of the second channel;

a first charge-storage gate dielectric disposed over a second portion of the first channel, and a second charge-storage gate dielectric disposed over a second portion of the second channel.

18. A semiconductor NVM dual cell as defined in claim 17, wherein each of the charge-storage gate dielectrics is multilayered.

19. A semiconductor NVM dual cell as defined in claim 18, wherein each of the charge-storage gate dielectrics comprises:

a bottom insulating layer;

a top insulating layer; and an intermediate charge-storage layer.

20. A semiconductor NVM dual cell as defined in claim 19, wherein the bottom insulating layer is an oxide, the top insulating layer is an oxide, and the intermediate charge-storage layer is a nitride.

21. A semiconductor NVM dual cell as defined in claim 20, wherein the bottom insulating layer is approximately 20 to 80 angstroms in thickness, the top insulating layer is approximately 50 angstroms in thickness, and the intermediate charge-storage layer is approximately 50 to 150 angstroms in thickness.

22. A semiconductor NVM dual cell as defined in claim 21, wherein each of the select gate dielectrics consists essentially of a single insulating layer.

* * * * *